(12) United States Patent
Suzuki et al.

(10) Patent No.: US 9,402,336 B2
(45) Date of Patent: Jul. 26, 2016

(54) COOLING STRUCTURE FOR INVERTER DEVICE

(71) Applicant: NTN CORPORATION, Osaka (JP)

(72) Inventors: Minoru Suzuki, Iwata (JP); Tetsuya Yamamoto, Iwata (JP); Koichi Okada, Iwata (JP)

(73) Assignee: NTN CORPORATION, Osaka (JP)

( * ) Notice: Subject to any disclaimer, the term of this patent is extended or adjusted under 35 U.S.C. 154(b) by 0 days.

(21) Appl. No.: 14/391,095

(22) PCT Filed: Apr. 3, 2013

(86) PCT No.: PCT/JP2013/060161
§ 371 (c)(1),
(2) Date: Oct. 7, 2014

(87) PCT Pub. No.: WO2013/153997
PCT Pub. Date: Oct. 17, 2013

(65) Prior Publication Data
US 2015/0070841 A1  Mar. 12, 2015

(30) Foreign Application Priority Data

Apr. 10, 2012 (JP) .................................. 2012-088900

(51) Int. Cl.
*H05K 7/20* (2006.01)
*H02M 7/537* (2006.01)
(Continued)

(52) U.S. Cl.
CPC .............. *H05K 7/2089* (2013.01); *B60L 1/003* (2013.01); *B60L 3/003* (2013.01); *B60L 3/0061* (2013.01);
(Continued)

(58) Field of Classification Search
CPC ....... H05K 7/2089; H05K 7/208; H05K 7/20; H05K 7/20927; G06F 1/20; H01L 23/473; H01L 23/427; F28F 3/02; F28F 7/00; B60L 3/00; H02K 9/19; F28D 15/02

USPC ....................... 361/679.46–679.54, 688, 689, 361/698–715, 719–727; 165/80.2, 80.4, 165/80.5, 104.33, 104.34, 185; 257/706–727; 174/50, 50.02, 15.1, 174/16.3; 363/141–148; 310/54, 64; 62/259.2

See application file for complete search history.

(56) References Cited

U.S. PATENT DOCUMENTS 5,198,889 A   3/1993 Hisano et al.
5,316,077 A * 5/1994 Reichard .................. F28F 3/12
                                                          165/104.28

(Continued)

FOREIGN PATENT DOCUMENTS

CN   2662522 Y   12/2004
CN   1635693 A    7/2005

(Continued)

OTHER PUBLICATIONS

International Search Report mailed Jul. 9, 2013, in corresponding International Patent Application No. PCT/JP2013/060161.

(Continued)

*Primary Examiner* — Michail V Datskovskiy

(57) ABSTRACT

A cooling structure for an inverter (31) controls a motor (6) to drive an automobile. This inverter device (22) includes a power circuit section (28) having an inverter (31) to convert a DC power of a battery (19) to an AC power for the motor (6), and a casing (39) enclosing the power circuit section (28). A fin (41) is provided in an outer surface of the casing (39), a coolant path (42) for the flow of a cooling medium is provided within the casing (39) or in the outer surface thereof, and a pump (43) circulating the cooling medium in the coolant path (42) is disposed on or in the casing (39). With this structure, the flow resistance for cooling the inverter (31) is reduced to allow the pump (43) to be downsized and a proper cooling can be accomplished to the amount of heat by the inverter (31).

8 Claims, 9 Drawing Sheets

(51) Int. Cl.
*B60L 1/00* (2006.01)
*B60L 3/00* (2006.01)
*B60L 11/18* (2006.01)
*B60L 15/20* (2006.01)
*B60K 11/02* (2006.01)
*B60K 7/00* (2006.01)
*B60K 11/06* (2006.01)
*B60K 1/00* (2006.01)
*B60K 1/04* (2006.01)

(52) U.S. Cl.
CPC ......... *B60L 11/1803* (2013.01); *B60L 11/1874* (2013.01); *B60L 15/2009* (2013.01); *B60L 15/2036* (2013.01); *H02M 7/537* (2013.01); *H05K 7/209* (2013.01); *H05K 7/20927* (2013.01); *B60K 7/0007* (2013.01); *B60K 11/02* (2013.01); *B60K 11/06* (2013.01); *B60K 2001/003* (2013.01); *B60K 2001/0416* (2013.01); *B60K 2007/0038* (2013.01); *B60K 2007/0092* (2013.01); *B60L 2220/14* (2013.01); *B60L 2220/44* (2013.01); *B60L 2240/36* (2013.01); *B60L 2240/423* (2013.01); *B60L 2240/525* (2013.01); *B60L 2250/26* (2013.01); *Y02T 10/644* (2013.01); *Y02T 10/645* (2013.01); *Y02T 10/7005* (2013.01); *Y02T 10/705* (2013.01); *Y02T 10/7275* (2013.01)

(56) References Cited

U.S. PATENT DOCUMENTS

| | | | | |
|---|---|---|---|---|
| 6,166,937 A * | 12/2000 | Yamamura | ............ | H01L 23/473 257/E23.098 |
| 6,621,701 B2 * | 9/2003 | Tamba | ............... | H05K 7/20927 165/80.4 |
| 6,961,244 B2 * | 11/2005 | Tsuchiya | ........... | H05K 7/20927 361/699 |
| 7,030,520 B2 * | 4/2006 | Takenaka | ................ | B60K 1/00 310/64 |
| 7,210,304 B2 * | 5/2007 | Nagashima | ............. | F28D 15/00 62/259.2 |
| 7,569,957 B2 * | 8/2009 | Aoki | ..................... | H01L 23/473 310/52 |
| 7,579,805 B2 * | 8/2009 | Saito | .................. | H05K 7/20927 318/767 |
| 7,723,874 B2 * | 5/2010 | Woody | ..................... | H02K 9/20 310/52 |
| 7,728,467 B2 * | 6/2010 | Aoki | ................... | H01L 21/4878 310/54 |
| 7,796,389 B2 * | 9/2010 | Edmunds | .............. | H01L 23/427 165/104.14 |
| 7,954,334 B2 * | 6/2011 | Sasaki | ...................... | B60L 3/00 340/584 |
| 8,291,967 B2 * | 10/2012 | Yoshida | .................... | F28F 3/02 165/104.21 |
| 8,879,259 B2 * | 11/2014 | Suzuki | ............... | H05K 7/20936 165/104.33 |
| 2001/0012212 A1 | 8/2001 | Ikeda | | |
| 2002/0011327 A1 * | 1/2002 | Fukazu | .................... | F28F 3/04 165/80.4 |
| 2003/0067749 A1 * | 4/2003 | Tamba | ............... | H05K 7/20927 361/699 |
| 2010/0128436 A1 * | 5/2010 | Edmunds | .............. | H01L 23/427 361/700 |
| 2010/0321889 A1 * | 12/2010 | Yoshino | ............. | H05K 7/20927 361/702 |

FOREIGN PATENT DOCUMENTS

| | | | |
|---|---|---|---|
| CN | 2775081 Y | 4/2006 | |
| CN | 1851908 A | 10/2006 | |
| EP | 2781380 A1 * | 11/2011 | ............... B60H 1/32 |
| JP | 60-158986 | 10/1985 | |
| JP | 62-16022 | 1/1987 | |
| JP | 4-242963 | 8/1992 | |
| JP | 4-124806 | 11/1992 | |
| JP | 9-130075 | 5/1997 | |
| JP | 2005-137128 | 5/2005 | |
| JP | 2009-260113 | 11/2009 | |
| JP | 2010-184633 | 8/2010 | |

OTHER PUBLICATIONS

International Preliminary Report on Patentability mailed Oct. 23, 2014 in corresponding International Patent Application No. PCT/JP2013/060161.

* cited by examiner

COOLING STRUCTURE FOR INVERTER DEVICE

CROSS REFERENCE TO THE RELATED APPLICATION

This application is a U.S. National Stage Application which claims the benefit under 35 U.S.C. 371 of PCT International Patent Application PCT/JP2013/060161, filed Apr. 3, 2013, which is based on and claims foreign priority benefit of Japanese patent application No. 2012-088900, filed Apr. 10, 2012, the entire disclosures of which are herein incorporated by reference as a part of this application.

BACKGROUND OF THE INVENTION

1. Field of the Invention

The present invention relates to a cooling structure for an inverter device which may be mounted on, for example, an electrically powered automobile or the like.

2. Description of Related Art

In the standard automobile that is driven by an internal combustion engine, a radiator for cooling the internal combustion engine is generally provided within an engine compartment that is disposed in a front portion of the automobile body structure. In the case of the electrically powered automobile, no internal combustion engine is employed, but an inverter for a motor used to drive the automobile need be cooled since the inverter develops a heat during the use of such electrically powered automobile. Various techniques have hitherto been suggested such as, for example, a technique of liberating heats from the inverter by means of heat exchange with a supercharged air flowing through an intercooler (as disclosed in the patent document 1 listed below) and a technique of liberating heats from the inverter by means of the system in which, as shown in a conceptual diagram of FIG. 16, a medium heated by the inverter 70 is supplied to the radiator 72 through a piping path 71 so that the medium, cooled as a result of the heat exchange taking place in the radiator 72, may be supplied by the pump 73 to the inverter 70 to thereby cool.

[Patent Document 1] JP Laid-open Patent Publication No. 2010-184633

According to the conventional art, if the distance from the radiator 72 inside the bonnet to the inverter 70 on the automobile chassis is substantial, the piping path 71 becomes correspondingly substantial and, therefore, the flow resistance tends to increase to such an extent as to result in the increase of a load on a pump 73 for circulation. For this reason, it is difficult to downsize the pump 73. Also, since the inverter 70 is apt to emit heat less than that from the internal combustion engine, the capacity of the radiator 72 of a type that is mounted on the automobile of the same automobile classification tends to become large for the amount of heat generated by the inverter 70, resulting in over performance.

SUMMARY OF THE INVENTION

In view of the foregoing, the present invention has for its primary object to provide a cooling structure for an inverter device, in which the flow resistance for cooling the inverter is reduced to allow the pump to be downsized and, also, cooling that is proper for the amount of heat generated by the inverter can be accomplished.

In order to accomplish the foregoing object, the cooling structure for the inverter device, which is designed in accordance with the present invention, is a cooling structure for an inverter device, in which the inverter device includes a power circuit section including an inverter configured to convert a direct current power of a battery to an alternating current power for driving the motor, and an inverter casing to enclose the power circuit section; and a fin provided in an outer surface area of the inverter casing, a coolant flow path provided within the inverter casing or in the outer surface area for the flow of a cooling medium therethrough, and a pump disposed in the inverter casing to circulate the cooling medium within the coolant flow path.

According to the present invention, the inverter of the power circuit section converts the direct current power of the battery to the alternating current power for driving the motor. While the inverter emits heat at this time, the flow of the cooling medium through the coolant flow path provided within the inverter casing or in the outer surface area allows the inverter to be properly cooled in dependence on the amount of heat emitted by the inverter. Also, the heat can be dissipated from the fin which has an increased heat transfer area on the outer surface area of the inverter casing. Since the pump for circulating the cooling medium within the coolant flow path is installed within the inverter casing, it is possible to reduce the length of the piping path as compared with that according to the conventional art and then to reduce the flow resistance. Accordingly, not only can the pump be downsized, but also the use of any existing radiator can be dispensed with, and, therefore, the weight of the automobile as a whole can be reduced. The reduction in weight of the automobile as a whole can lead to the increase of the mileage.

In a preferred embodiment of the present invention, an inverter temperature detecting unit may be employed to detect the temperature of the inverter, along with a pump control unit which performs such a control that, in the event that the temperature detected by the inverter temperature detecting unit exceeds a preset value, the pump is driven to circulate the cooling medium. The term "preset value" referred to above is determined in reference to the capacity of the cooling medium, possessed by the coolant flow path within the inverter casing. According to this construction, the pump is not driven at all times, but the pump is driven to circulate the cooling medium when the temperature of the inverter exceeds the preset value, and, accordingly, for example, each of the driving elements of the inverter can be maintained at a temperature lower than the operation warranty temperature. Also, the load on the battery can be relieved.

In another preferred embodiment of the present invention, a pump control unit may also be employed to perform such a control that, in the event that an automobile traveling velocity is not higher than a predetermined value, the pump is driven to circulate the cooling medium. By way of example, when the automobile is higher than a predetermined velocity, the fin of the inverter casing is air cooled by the incoming wind and, accordingly, the inverter is cooled. When the automobile traveling velocity is lower than the predetermined value, for example, when the automobile is traveling on the congested road, since the effect of the fin being air cooled by the incoming wind is low, the pump control unit drives the pump to forcibly circulate the cooling medium. Accordingly, the inverter can be assuredly cooled regardless of the automobile traveling velocity. The pump may, in addition, be designed to be driven for a predetermined length of time, after the automobile has been brought to a halt, regardless of the inverter temperature attained at that time. After the automobile has been brought to the halt, the fin is not air cooled by the incoming wind, and, accordingly, with the drive of the pump taking place for the predetermined length of time regardless of the inverter temperature, the cooling medium can be forcibly circulated. Accordingly, the inverter can be assuredly cooled.

In a further preferred embodiment of the present invention, a cooling water tank to reserve a cooling water may be employed in the vicinity of a portion within the inverter casing where the fin is provided. In this case, when the fin is cooled, the cooling water tank is also efficiently cooled. Since the cooling water tank is disposed within the inverter casing, as compared with the case in which the cooling water tank is disposed outside the inverter casing which is then connected with the tank by means of a piping, the piping path can be shortened and the flow resistance can be reduced. Accordingly, the pump can be downsized and, hence, the weight of the automobile as a whole can be reduced. It is to be noted that a stirrer for stirring the cooling water within the cooling water tank may be provided in the inverter casing. With the stirrer being driven, the cooling water within the cooling water tank is stirred to allow the cooling water to be uniformly cooled. Thereby, the inverter as a whole can be cooled all around.

In a still preferred embodiment of the present invention, where the automobile body has an under guard disposed therein, the fin may be disposed between the automobile body and the under guard while being exposed. In this case, during the drive of the automobile, the incoming wind enters from between the automobile body and the under guard and the exposed fin is effectively cooled. The fin referred to above may be so disposed as to be parallel relative to the direction of travel of the automobile. In such case, the incoming wind entering from between the automobile body and the under guard smoothly flows along the fin without being, for example, stagnated half the way of the automobile traveling direction and, also, will not constitute an air resistance. The inverter referred to above may include a driving element and this driving element may be fixed inside the fin then exposed. The incoming wind enters from between the automobile body and the under guard and, hence, not only is the exposed fin cooled, but also the driving element inside the fin is effectively cooled.

Where the automobile body has an under guard disposed therein, the coolant flow path provided on the outer surface area of the inverter casing may be disposed so as to be exposed between the automobile body and the under guard. In this case, during the drive of the automobile, the incoming wind enters from between the automobile body and the under guard, and the exposed coolant flow path is effectively cooled. The under guard referred to above may be provided with an air intake hole through which air is drawn into a space between the automobile body and the under guard. During the drive of the automobile, the air can be drawn in between the automobile body and the under guard through the air intake hole and, hence, the inverter is air cooled. It is to be noted that the air intake hole in the under guard may be provided with a filter for removing foreign matter. In this case, it is possible to prevent an undesirable ingress of the foreign matter such as, for example, flying objects, which come from the air intake hole 56a together with the air, in between the automobile body and the under guard 56. It is to be noted that the filter 57 may be detachably provided in the hole 56a in the under guard 56.

Any combination of at least two constructions, disclosed in the appended claims and/or the specification and/or the accompanying drawings should be construed as included within the scope of the present invention. In particular, any combination of two or more of the appended claims should be equally construed as included within the scope of the present invention.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims. In the accompanying drawings, like reference numerals are used to denote like parts throughout the several views, and:

DESCRIPTION OF EMBODIMENTS

Figure 1:
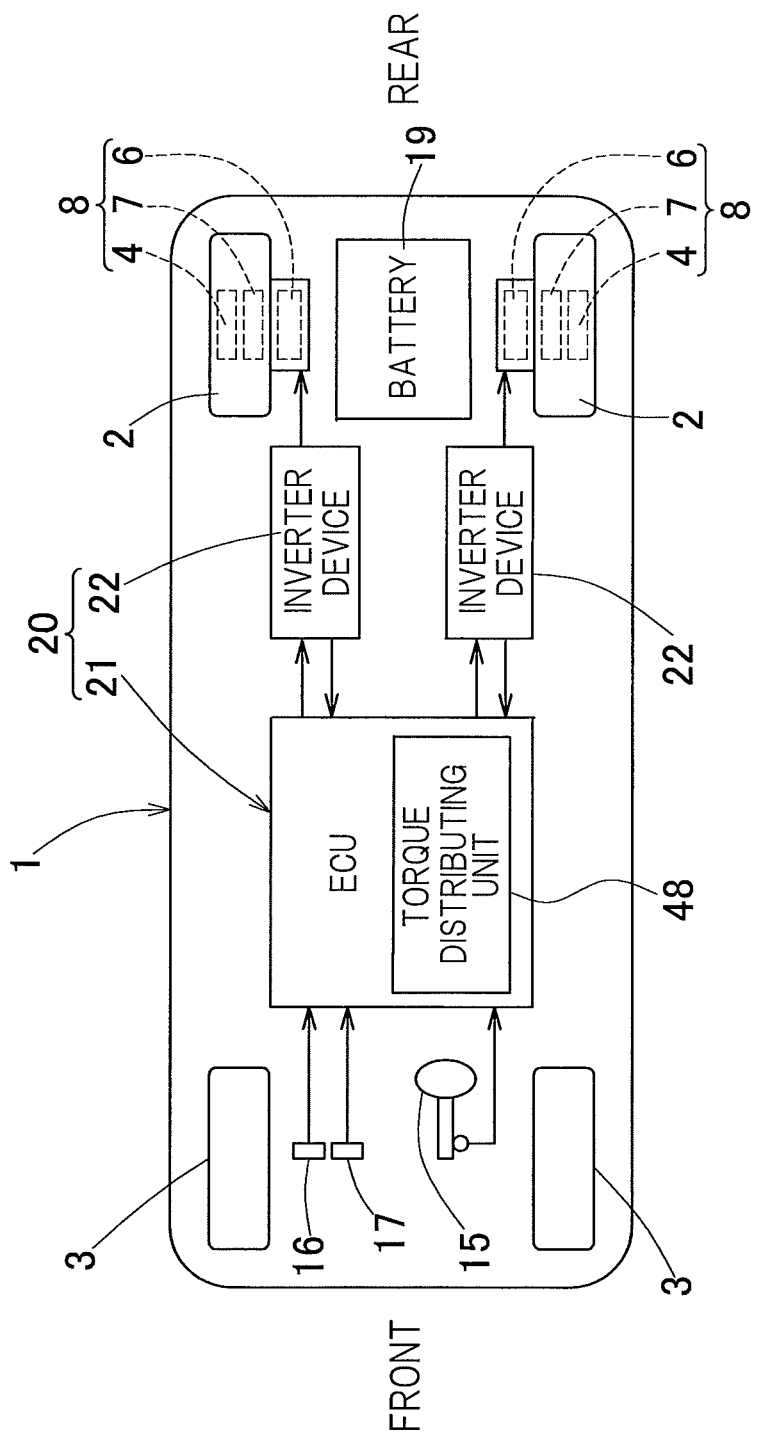
FIG. 1 is a block diagram showing an conceptual structure of an electrically powered automobile, schematically shown in a top plan view, in which automobile makes use of a cooling structure for an inverter device that is designed in accordance with a first embodiment of the present invention.

The first embodiment of the present invention will now be described with particular reference to FIGS. 1 to 6. In particular, FIG. 1 is a block diagram in which a conceptual construction of the electrically powered automobile employing a cooling structure for an inverter device, which is designed in accordance with this embodiment of the present invention, is shown in a top plan view. This electrically powered automobile is a four wheeled automobile in which wheels 2, which are left and right rear wheels of an automobile body structure 1, are rendered to be drive wheels and wheels 3, which are left and right front wheels, are rendered to be driven wheels. The wheels 3, which are the front wheels, are rendered to be steering wheels. The left and right wheels 2 and 2, which are the drive wheels, are driven by respective motors 6 for independent driving. The rotation of each of the motors 6 is transmitted to the corresponding wheel 2 through a speed reducer or a reduction gear 7 and a wheel support bearing assembly 4. Those motor 6, speed reducer 7 and wheel support bearing assembly 4 cooperate with each other to form an in-wheel motor drive device 8 which is a single assembled component. The in-wheel motor drive device 8 is of a structure in which the corresponding motor 6 is disposed in the vicinity of the associated wheel 2, and a portion or the whole of the motor drive device 8 is disposed within the wheel 2. Each of the wheels 2 and 3 is provided with a brake that is not shown in the drawings.

A control system will now be explained. The automobile body 1 has mounted thereon a motor drive device 20 including an ECU 21 and a plurality of inverter devices 22. The ECU 21 is a host control unit for performing an overall control of the automobile as a whole and supplying commands to each of the inverter devices 22. Each of the inverter devices 22 performs a control of the respective motor 6 for driving purpose in accordance with a command of the ECU 21. This ECU 21 is comprised of a computer, a program executed by such computer, and various electronic circuits of varying types. It is to be noted that light or weak electric systems which the ECU 21 and each of the inverter devices 22 belong may be comprised of a commonly sharing computer and electric circuits on a commonly shearing substrate.

The ECU 21 has a torque distributing unit 48. This torque distributing unit 48 makes use of a signal indicative of the opening degree of an accelerator outputted by an accelerator operating section 16, a deceleration command outputted by a brake operating section 17 and a turn command outputted by a steering section 15, to generate, as a torque value, an acceleration/deceleration command to be applied to the motors 6 and 6 for driving the left and right wheels, and supplies so generated command to each of the inverter devices 22. Also, the torque distributing unit 48 has a function of distributing a braking torque command value, which is used for causing the motor 6 to function as a regenerative brake and a braking torque command value which is used for operating the brake not shown, in the event of the presence of a deceleration command outputted by the brake operating section 17. The braking torque command value used to function as the regenerative brake is reflected in the torque command value for the acceleration/deceleration command applied to each of the driving motors 6 and 6. The accelerator operating section 16 referred to above includes a pedal such as, for example, an accelerator pedal and a sensor for detecting the moving amount of the pedal or the amount of the pedal that is operated, and the brake operating section 17 includes a pedal such as, for example, a brake pedal and a sensor for detecting the moving amount of the pedal. The steering unit 15 includes a steering wheel and a sensor for detecting the angle of rotation thereof. A battery 19 is mounted on the automobile body 1 and is used an electric source for driving the motors 6 and for an electric system of the automobile in its entirety.

Figure 2:
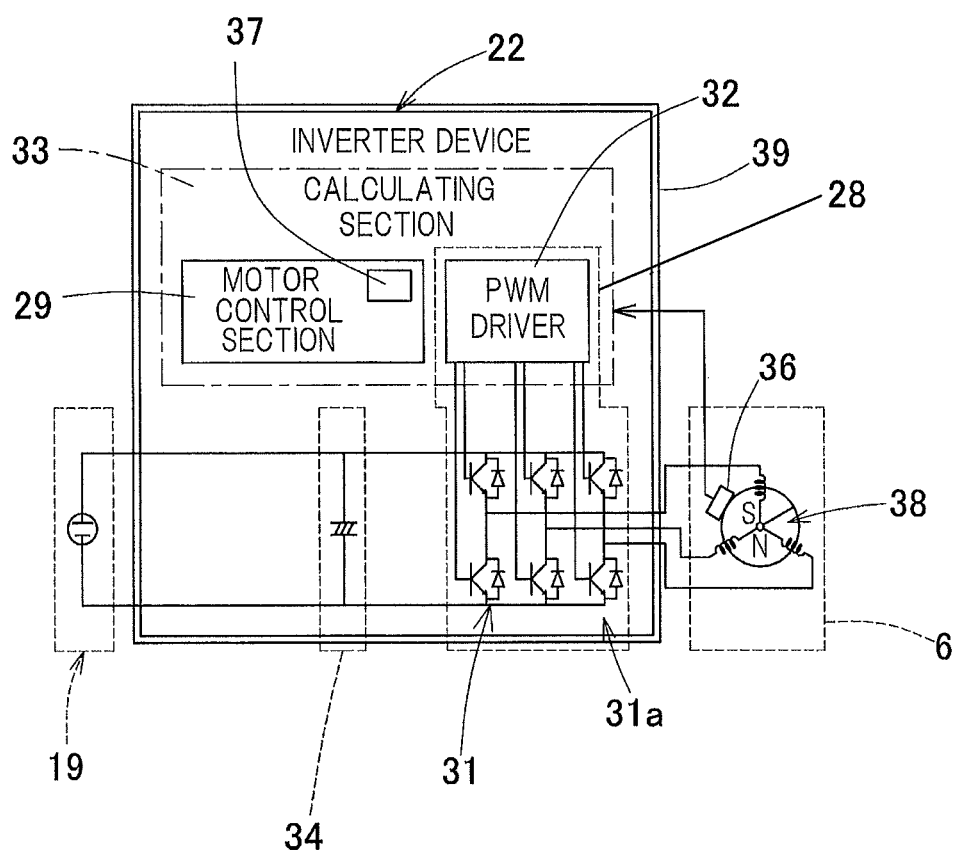
FIG. 2 shows a circuit part of the inverter device in the electrically powered automobile.

As shown in FIG. 2, the inverter device 22 includes a power circuit section 28 provided for each of the motors 6, a motor control section 29 for controlling the power circuit section 28, an inverter casing 39 of a generally rectangular configuration for enclosing the power circuit section 28 and the motor control section 29, and a coolant flow path and a pump both referred to hereinafter. It is to be noted that the motor control section 29 may be provided in common with or separately from the power circuit sections 28. The motor control section 29 has a function of outputting to the ECU 21, various information such as, for example, each detection value and control values, which is associated with the in-wheel motor drive device 8 possessed by the motor control section 29. The power circuit section 28 includes an inverter 31 and a PWM driver 32 for controlling this inverter 31. The inverter 31 referred to above converts a direct current electricity of the battery 19 into an alternating current electricity, which is of three phase, that is used for driving the motor 6.

The motor 6 is employed in the form of a three phase synchronous motor such as, for example, an IPM (Interior Permanent Magnet) synchronous motor or the like. The inverter 31 referred to above is comprised of a plurality drive elements 31a and is operable to output a driving current of each of the three phases (U, V and W phases) of the motor 6 in the form of pulse waveforms. For each of the driving elements 31a, a semiconductor switching element is adopted. The PWM driver 32 referred to above is operable to perform a pulse width modulation on the basis of an electric current command inputted and then to apply an OF/OFF command to each of the driving elements 31a. By way of example, so that a sinusoidal driving current may be outputted from the inverter 31, the PWM driver 32 performs the pulse width modulation. The sinusoidal driving current is inputted to the motor 6 as shifted 120° in phase for each phase.

The motor control section 29 and the PWM driver 32, which form a weak electric circuit section of the power circuit section 28, cooperate with each other to form a calculating section 33 which is a weal electric circuit part in the inverter device 22. The calculating section 33 is comprised of a computer, a program executable by this computer and electronic circuits. Besides the above, the inverter device 22 is provided with a smoothing section 34 in the form of a smoothing capacitor interposed in parallel between the battery 19 and the inverter 31. The motor 6 referred to above is provided with a motor rotor angle detector 36 for detecting the angle of a motor rotor 38. In this motor 6, in order to maximize the efficiency thereof, the timing of application of each phase of each wave of the alternating electric current to be supplied to a coil forming a stator is controlled by a motor drive control section 37 of the motor control section 29 on the basis of the relative rotational angle between the stator and the motor rotor 38, which is detected by the motor rotor angle detector 36.

Figure 3:
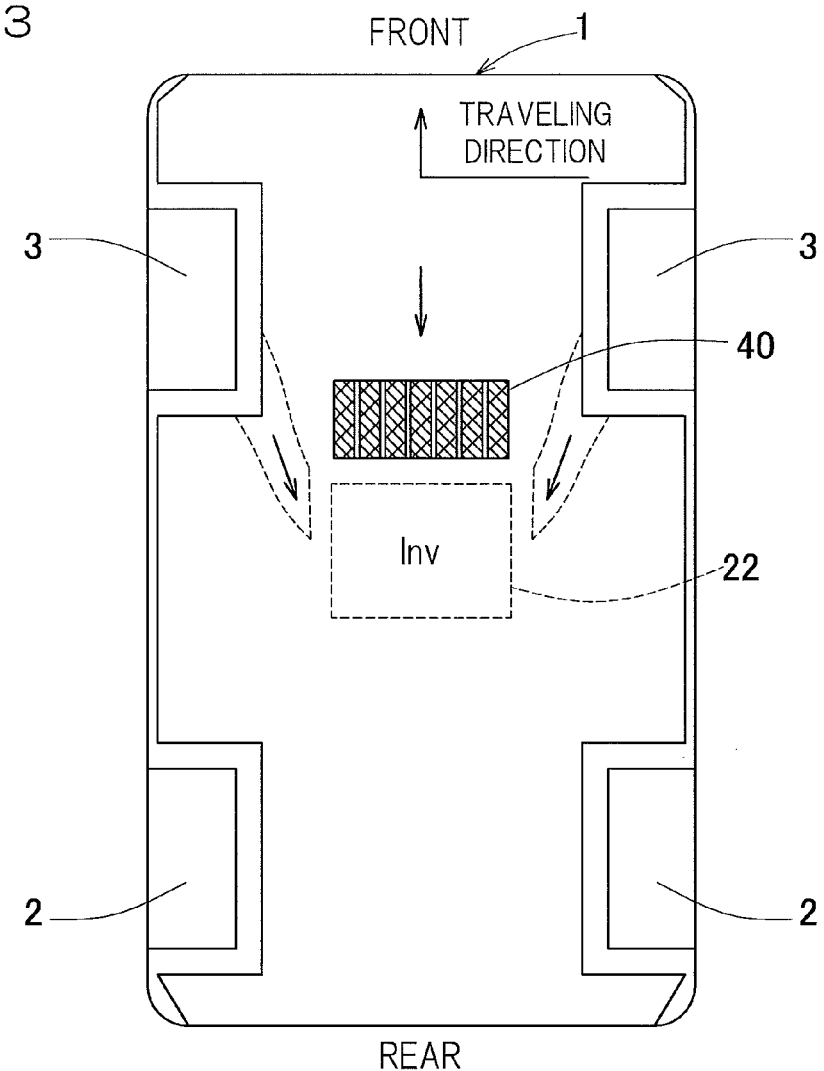
FIG. 3 is a diagram showing an exemplary layout of the inverter device as viewed from the underside of an automobile chassis.

The cooling structure for the inverter device 22 will now be described in detail. FIG. 3 illustrates a diagram showing an exemplary layout in which the inverter device 22 is viewed from the undersurface of the automobile body. The inverter device 22 is, in the instance as shown, disposed intermediate of the automobile traveling direction, that is, intermediate of a forward and rearward direction of the automobile body 1 and also intermediate of the automobile width direction. An air filter 40 is provided at a portion of the automobile body 1 immediately forwardly of the inverter device 22. The incoming wind entering from an area forwardly of the automobile body, after foreign matter has been removed by the air filter 40, impinges upon the inverter device 22, and is thus provided for cooling of the inverter 31 shown in FIG. 2. The incoming wind from slantwise forwardly of the automobile body impinges directly upon the inverter device 22 without the air filter 40 being interposed, and is thus provided for cooling. It is to be noted that the use of the air filter 40 can be dispensed with if a function that substitutes for the air filter 40 is provided in the automobile body 1 or the inverter device 22.

Figure 4:
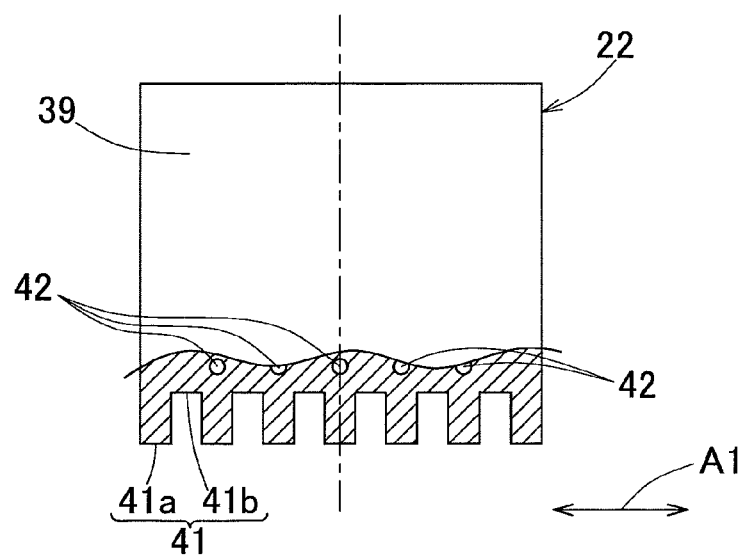
FIG. 4 is a schematic front elevational view of the inverter device with a portion thereof broken away.

As shown in FIG. 4, a portion of an outer surface area of the inverter casing 39, which is an undersurface area thereof in the instance as shown, is provided with a fin 41 for increasing the surface area of the inverter casing 39. This fin 41 is comprised of a plurality of alternating recessed segments 41b and protruding segments 41a and those recessed segment 41b and protruding segments 41a are alternately lined up in the undersurface area of the inverter casing 39 in the direction parallel to the automobile widthwise direction indicated by the arrow A1. Those recessed segments 41b and protruding segments 41a are disposed parallel to each other in the undersurface area in the direction parallel to the automobile widthwise direction. Accordingly, the incoming wind flowing from the area forwardly of the automobile body towards the undersurface area of the inverter casing 39 can flow smoothly without being, for example, detained en passant along the fin 41 in a direction parallel to the automobile traveling direction.

Figure 5:
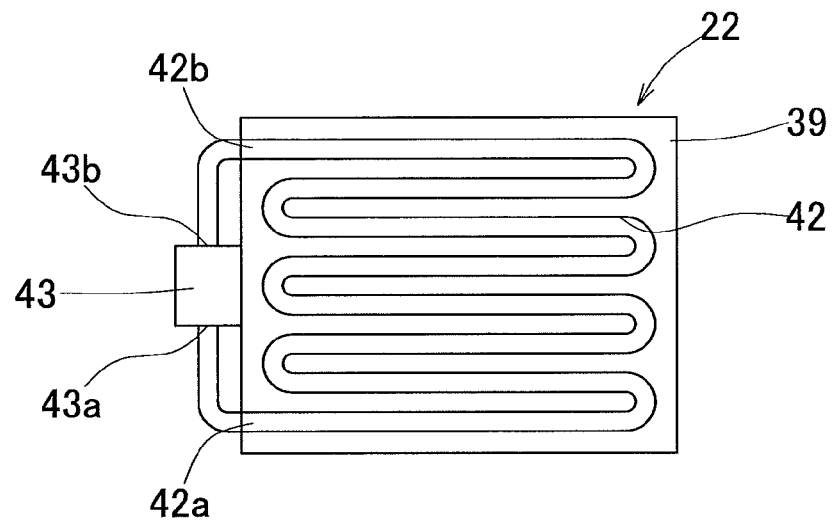
FIG. 5 is a diagram showing an example in which a coolant flow path is provided within an inverter casing of the inverter device.
Figure 6:
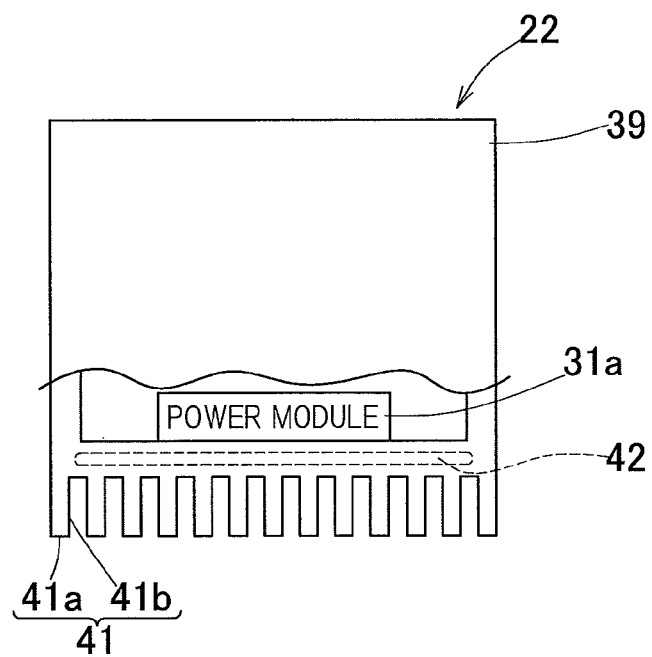
FIG. 6 is a diagram showing the positional relation between a driving element and fins within the inverter casing.

As shown in FIG. 5, a coolant flow path 42, through which a cooling medium flows, is provided within the inverter casing 39. Also, the inverter casing 39 has an outer surface area on which a pump 43 for circulating the cooling medium within the coolant flow path 42 is mounted. The coolant flow path 42 is concentratedly provided in the vicinity of an area in which the most sizable amount of heat emission takes place within the inverter casing 39. More specifically, the coolant flow path 42 is provided centered in the vicinity of a casing lower portion within the inverter casing 39 where driving elements 31a are disposed as shown in FIG. 6. In other words, within the inverter casing 39, the coolant flow path 42 is provided in the casing lower portion between the driving elements 31a and the fins 41. As shown in FIG. 5, the coolant flow path 42 is in the form of a single flow passage provided in the form of meander in the vicinity of the casing lower portion and has, at one end, an inlet portion 42a which is fluid connected with a discharge port 43a of the pump 43 and to which the cooling medium discharged from the pump 43 is introduced. The other end of the coolant flow path 42 opposite to the inlet portion 42a has an outlet portion 42b which is fluid connected with a suction port 43b of the pump 43 and through which the cooling medium used for cooling is returned to the pump 43.

Figure 7:
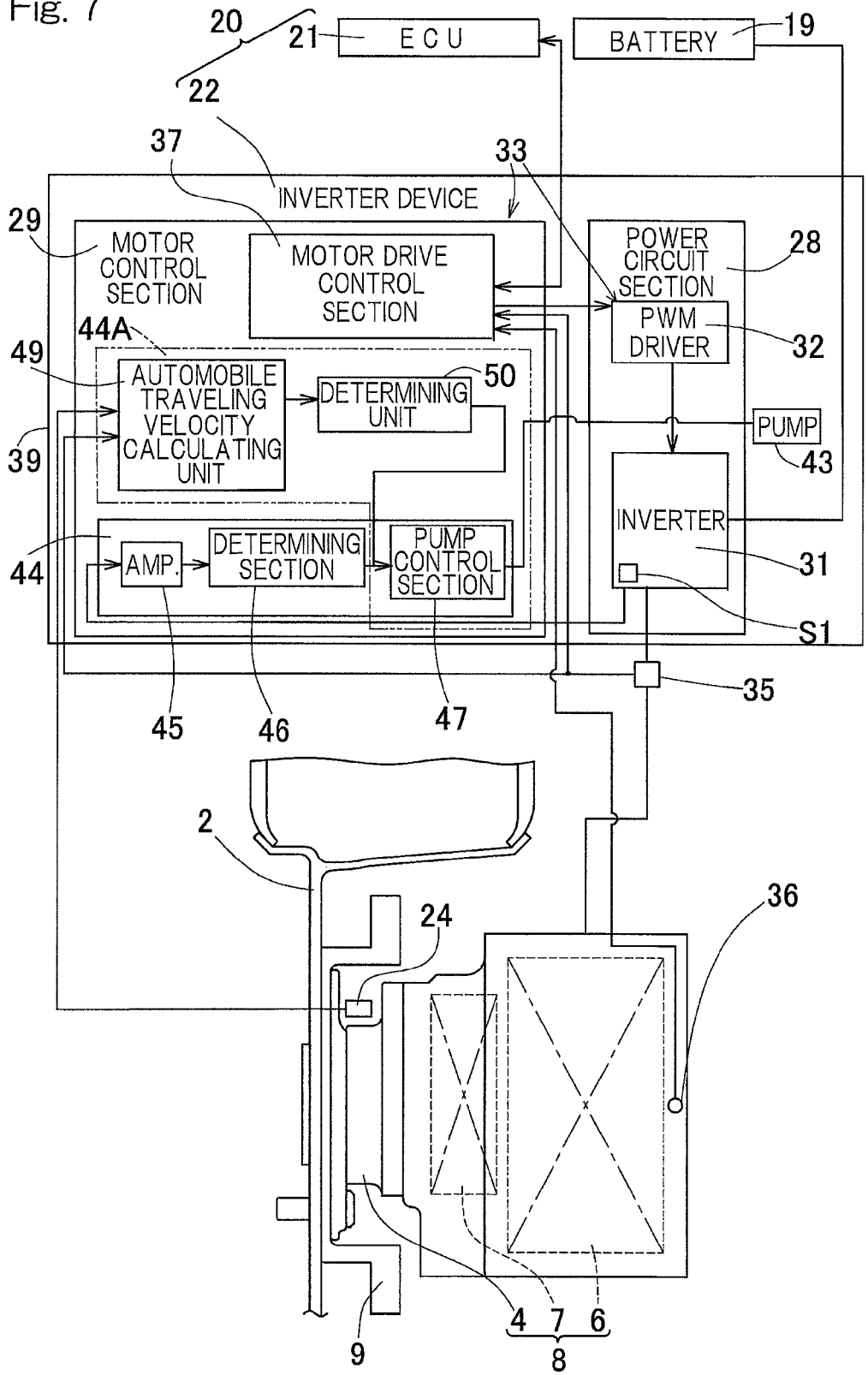
FIG. 7 is a block diagram showing a control system of the electrically powered automobile.

The control system will be hereinafter detailed. As shown in FIG. 7, the inverter 31 is provided with an inverter temperature detecting unit S1 for detecting the temperature of the inverter 31. For the inverter temperature detecting unit S1, a thermister, for example, is employed. The motor control section 29 referred to previously is provided with a pump control unit 44 for controlling the pump 43. This pump control unit 44 includes an amplifier 45 for amplifying a detection value detected by the inverter temperature detecting unit S1, a determining section 46 for determining whether or not the value amplified by the amplifier 45 exceeds a preset value, and a pump control section 47 for driving the pump 43 on the basis of the result of determination done by the determining section 46.

The term "preset value" referred to above is determined in reference to, for example, the balance between the operation warranty temperature of each of the driving elements 31a and the capacity of the cooling medium held by the coolant flow path within the inverter casing 39. Specifically, by means of a series of experiments or the like, the preset value, for example, is suitably determined according to the relationship between the capacity of the coolant flow path and the temperature of the inverter 31 that will not result in any problem such as, for example, thermal runaway of each of the driving elements 31a. The detection value detected by the inverter temperature detecting unit S1 is amplified by the amplifier 45 and the amplified value is then determined at all times by the determining section 46. When the determining section 46 determines that the amplified value exceeds the preset value mentioned above, the pump control section 47 causes the pump 43 to perform a control to drive the pump 43 and then to circulate the cooling medium within the coolant flow path 42 (FIG. 5).

It is to be noted that a pump control unit 44A for performing a control to drive the pump 43 and then to circulate the cooling medium when the automobile traveling velocity is not higher than a predetermined velocity may be provided either together with the pump control unit 44 for performing a drive control of the pump 43 on the basis of the inverter temperature referred to previously or in place of the previously described pump control unit 44. The pump control unit 44A includes an automobile traveling velocity calculating unit 49, a determining unit 50, and a pump control section 47. The automobile traveling velocity calculating unit 49, the determining unit 50 and the pump control section 29, all referred to above, are provided in the motor control section 29.

The automobile traveling velocity calculating unit 49 is connected with a rotation sensor 24 affixed to the wheel support bearing assembly 4 and with an electric current sensor 35 for detecting the current value that is supplied to the motor 6. This automobile traveling velocity calculating unit 49 calculates the automobile traveling velocity either by obtaining information on the tire revolution number from the rotation sensor 24 or by obtaining a motor current value from the electric current sensor 35 on the basis of data of the automobile traveling velocity that is proportional to the motor current value. The determining unit 50 referred to above is operable to determine at all times whether or not the automobile traveling velocity calculated by the automobile traveling velocity calculating unit 49 is not higher than the predetermined value, for example, 30 km per hour. If the determining unit 50 determines that the automobile traveling velocity is not higher than the predetermined value, the pump control section 47 controls to drive the pump 43 to circulate the cooling medium within the coolant flow path 42 (FIG. 5).

Functions and effects will be hereinafter described with particular reference to FIG. 7. The inverter 31 of the power circuit section 28 converts the direct current power of the battery 19 to the alternating current power for driving the motor 6. While at this time the inverter 31 emits heat, the flow of the cooling medium in the coolant flow path 42 provided within the inverter casing 39 is effective to properly cool the inverter 31 in dependence on the amount of heat emitted by the inverter 31. Also, the heat can be dissipated from the fin 41 which has an increased heat transfer area on the outer surface area of the inverter casing 31. Since the pump 43 for circulating the cooling medium within the coolant flow path 42 is installed within the inverter casing 39, it is possible to reduce the piping path as compared with that according to the conventional art and then to reduce the flow resistance. Accordingly, not only can the pump 43 be downsized, but also the use of any existing radiator can be dispensed with, and, therefore, the weight of the automobile as a whole can be reduced. The reduction in weight of the automobile as a whole can lead to the increase of the mileage.

Where the inverter temperature detecting unit S1 for detecting the temperature of the inverter 31 is employed and the pump control unit 44 is also provided for performing the control to drive the pump 43 to circulate the cooling medium in the event that the temperature detected by the inverter temperature detecting unit S1 exceeds the preset value, and when the pump 43 is not driven at all times but is driven to circulate the cooling medium in the event of the temperature of the inverter 31 exceeding the preset value, for example, each of the driving elements 31a of the inverter 31 can be maintained at a temperature lower than the operation warranty temperature. In the event that the temperature of the inverter 31 is not in excess of the preset temperature, there is no need to drive the pump 43 and, therefore, the load on the battery 19 can be relieved.

Where the pump control unit 44A performs the control to drive the pump 43 to circulate the cooling medium in the event of the automobile traveling velocity being lower than the predetermined value, the following functions and effects can be obtained. If, for example, the automobile traveling velocity is higher than the predetermined value, the fin 41 of the inverter casing 39 is air cooled by the incoming wind to cool the inverter 31. On the other hand, if the automobile traveling velocity is lower than the predetermined value, for example, if the automobile travels on the congested road, the effect of the fin 41 being air cooled by the incoming wind is lower and, therefore, the pump control unit 44A drives the pump 43 to forcibly circulate the cooling medium. Accordingly, the inverter 31 can be more assuredly cooled regardless of the automobile traveling velocity. The pump 43 may, further, be designed to be driven for a predetermined length of time, after the automobile has been brought to a halt, regardless of the inverter temperature attained at that time. After the automobile has been brought to the halt, the fin 41 is not air cooled by the incoming wind, and, accordingly, with the drive of the pump taking place for the predetermined length of time regardless of the inverter temperature, the cooling medium can be forcibly circulated. Accordingly, the inverter 31 can be assuredly cooled.

Hereinafter, second to fourth embodiments of the present invention will be described. It is, however, to be noted that, in the description that follows, component parts similar to those shown and described in connection with the preceding embodiments of the present invention are shown by like reference numerals and, therefore, the details thereof are not reiterated for the sake of brevity. Where only a part of the construction is described, the remaining part of the construction is to be understood as similar to that in the preceding embodiment or embodiments. It is also to be noted that where in describing one of the preferred embodiments, only a portion of the construction is referred to, other portions of such construction are to be understood as similar to those referred to in the previously described preferred embodiment or embodiments. Not only can component parts, which are specifically referred to in describing each of the preferred embodiments, be combined, but also parts of the preferred embodiments can be combined unless such combination pose any problem.

Figure 8:
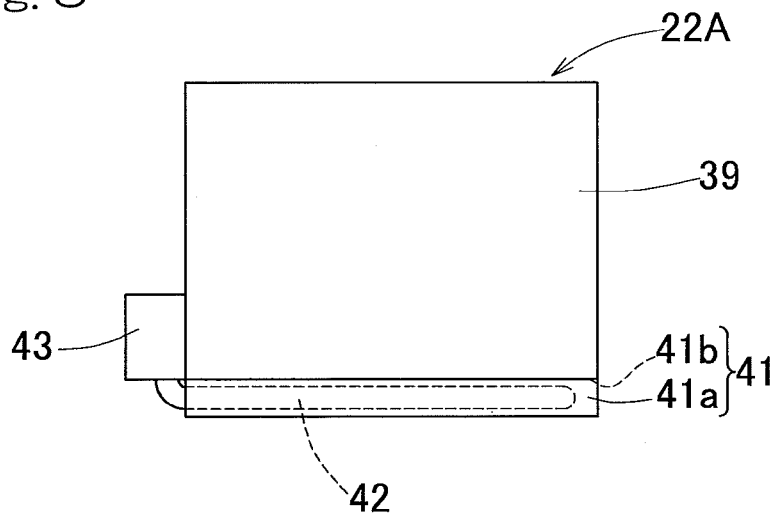
FIG. 8 is a front elevational view of the inverter device designed in accordance with a second embodiment of the present invention.
Figure 9:
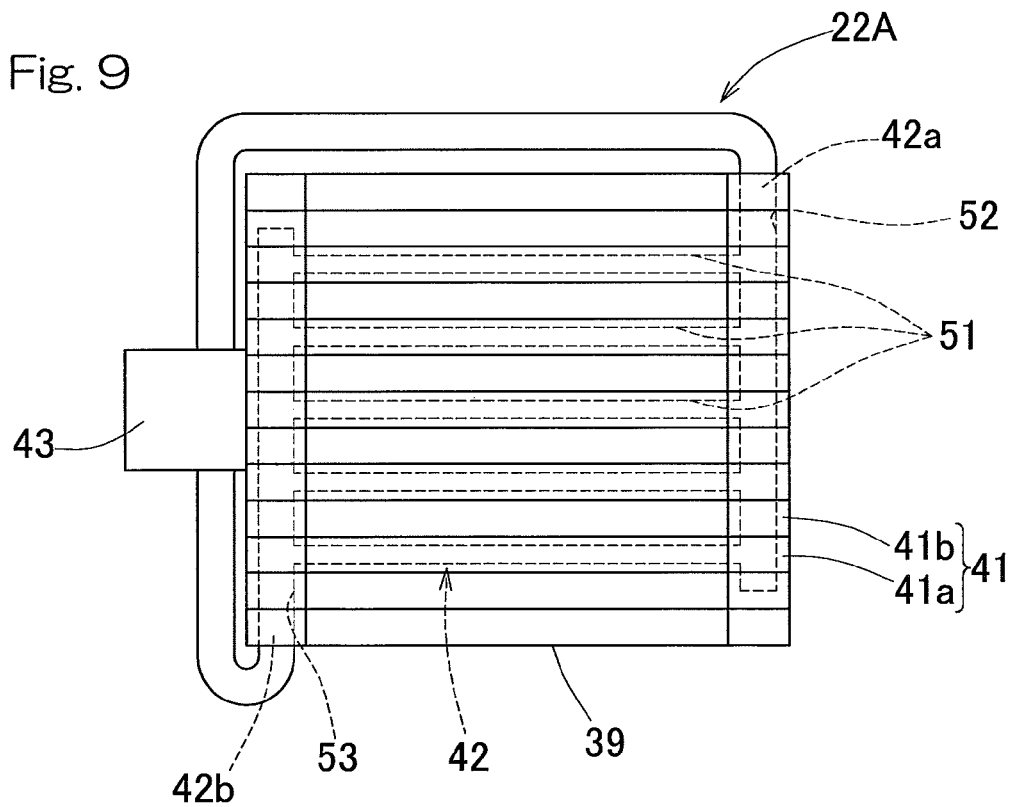
FIG. 9 is a diagram showing the exemplary layout of the inverter device as viewed from the underside of the automobile.
Figure 10:
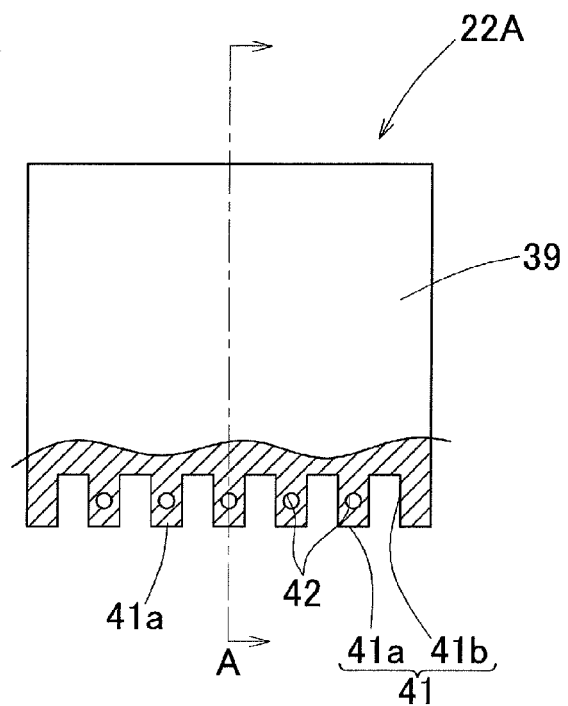
FIG. 10 is a schematic front elevational view showing the inverter device with a portion thereof broken away.
Figure 11:
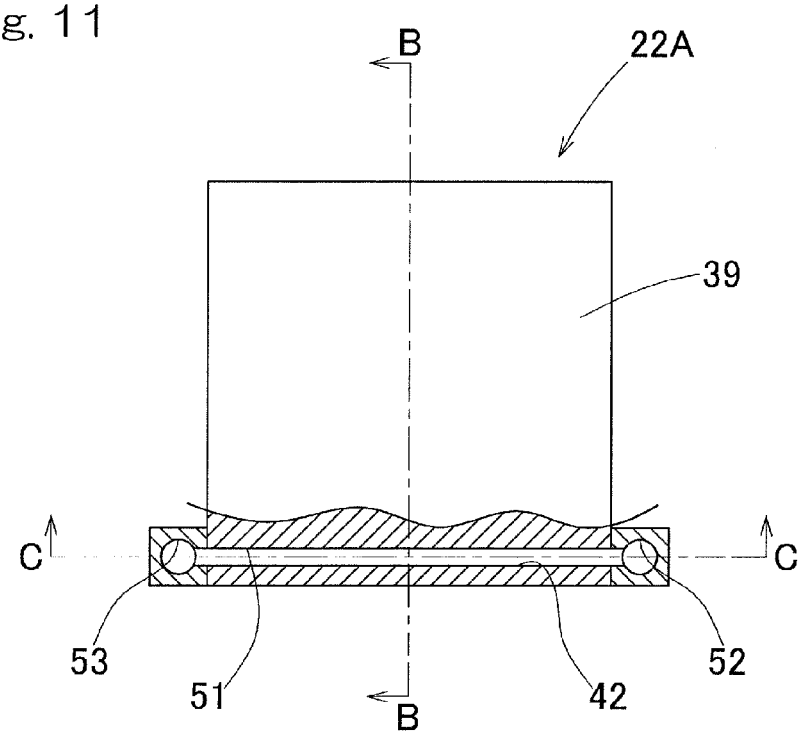
FIG. 11 is a schematic side view showing the inverter device with a portion thereof broken away.
Figure 12:
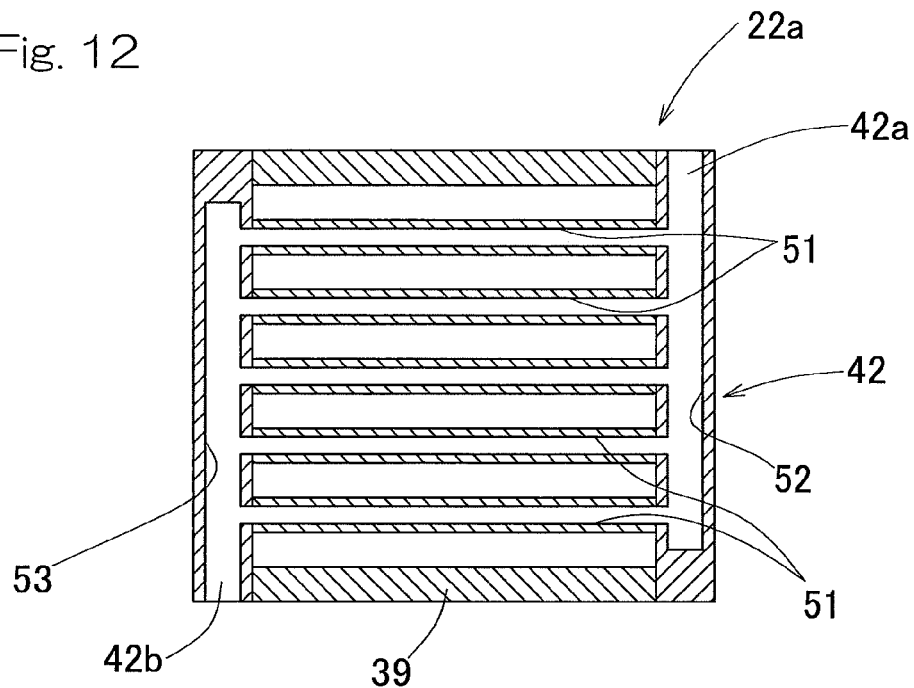
FIG. 12 is a cross sectional view taken along the line C-C in FIG. 11.

FIG. 8 illustrates a front elevational view of the inverter device 22A designed in accordance with the second embodiment of the present invention and FIG. 9 illustrates a diagram showing the exemplary layout of the inverter device 22A as viewed from the undersurface of the automobile body. FIG. 10 illustrates a front elevational view of the inverter device 22A with a portion thereof broken away (a cross sectional view taken along the line B-B in FIG. 11). FIG. 11 illustrates a cross sectional view taken along the line A-A in FIG. 10 and FIG. 12 illustrates a cross sectional view taken along the line C-C in FIG. 11.

In this example, as shown in FIG. 10, the coolant flow path 42 is provided in the fin 41 on the outer surface area of the inverter casing 39. This coolant flow path 42 includes, as shown in FIGS. 11 and 12, a plurality of primary coolant passages 51 formed within the protruding segments 41a of the fin 41 so as to extend in a direction parallel to the direction of extension of the fin 41, an inlet passage 52 communicated with one end of those primary coolant passages 51 and an outlet passage 53 communicated with the other end of the primary coolant passages 51. The inlet passage 52 has one end portion provided with an inlet portion 42a through which the cooling medium discharged from the pump 43 is introduced, and the outlet passage 53 has one end portion provided with an outlet portion 42b through which the cooling medium used in cooling is returned to the pump 43. Also, as shown in FIGS. 8 and 9, the pump 43 is installed on the outer surface area of the inverter casing 39.

According to the above described construction, when the pump 43 is driven, the coolant medium discharged from the pump 43 is introduced from the inlet portion 42a of the coolant flow path 42. The cooling medium so introduced flows from the inlet passage 52 towards the outlet passage 53 by way of each of the primary coolant passages 51. At this time, the heat dissipated from the inverter 31 (FIG. 7) can be efficiently dissipated from the fin 41 which has an increased heat transfer area. In particular, since the primary coolant passages 51 are formed in the protruding segments of the fin 41 that are exposed to the air, the heat can be dissipated more efficiently than the structure in which the coolant passage is formed in, for example, the inverter casing. The cooling medium used in cooling is discharged from the outlet portion 42b of the coolant flow path 42 and is then returned to the pump 43.

Figure 13:
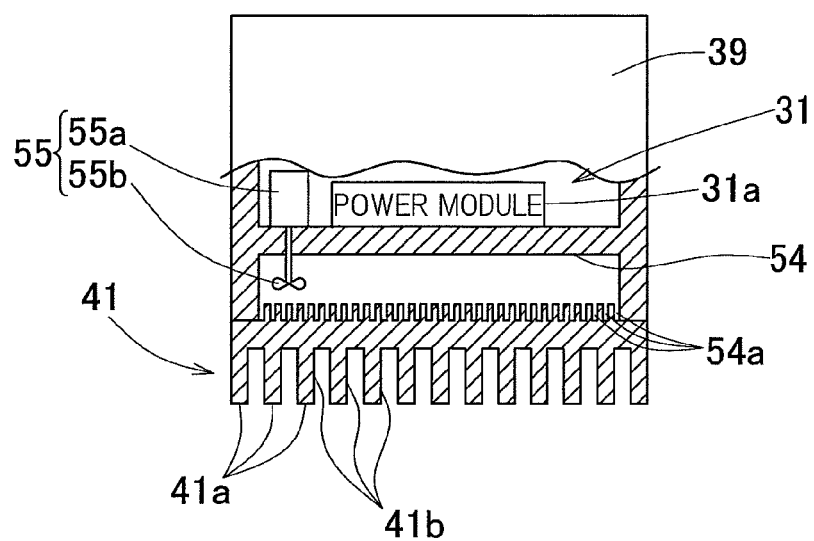
FIG. 13 is a front elevational view showing, with a portion thereof broken away, the inverter device designed in accordance with a third embodiment of the present invention.

As is the case with the third embodiment of the present invention shown in FIG. 13, a cooling water tank 54 for reserving the cooling water, as the cooling medium, may be provided in the vicinity of a portion of the inverter casing 39 where the fin 41 is provided. In the example as shown, within the inverter casing 39, each of the driving elements 31a of the inverter 31, which is a heating element, is disposed on an upper portion of the cooling water tank 54. The cooling water tank 54 is so formed as to represent a rectangular parallelepiped shape and an indented portion 54a for enhancing the heat dissipating effect is provided in a lower portion of this cooling water tank 54. Within this cooling water tank 54, the cooling water is reserved. This inverter casing 39 is provided with a stirrer 55 for stirring the cooling water within the cooling water tank 54. The stirrer 55 includes a stirrer main body 55a, disposed in the close vicinity of the inverter 31, and a screw 55b affixed rotatably to a shaft portion of the stirrer main body 55a, and the screw 55b referred to above is disposed within the cooling water tank 54. Accordingly, the cooling water within the cooling water tank 54, although it does not circulate, is stirred by the stirrer 55. This stirrer 55 may be driven in synchronism with the drive of the pump 54 (FIG. 7) or may be driven independently of the drive of the pump 43 (FIG. 7).

According to the above described construction, when the fin 41 is cooled, the cooling water tank 54 is also efficiently cooled. Since the cooling water tank 54 is provided within the inverter casing 39, the piping path can be shortened and the flow resistance can be reduced, as compared with, for example, the case in which the cooling water tank is disposed outside the inverter casing 39 and is then connected with the case 39 through one or more pipes. Accordingly, the pump 43 (FIG. 7) can be downsized and, therefore, the automobile as a whole can be reduced in weight. Also, with the stirrer 55 driven, the cooling water within the cooling water tank 54 is stirred to cool all around. Then, the inverter 31 as a whole can be cooled all around.

Figure 14:
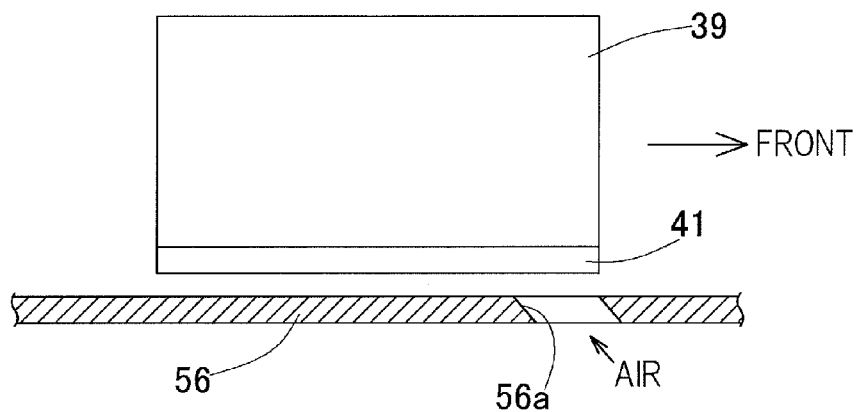
FIG. 14 is a side view showing the inverter device designed in accordance with a fourth embodiment of the present invention.

As is the case with the fourth embodiment of the present invention shown in FIG. 14, in the automobile body in which an under guard 56 is disposed, the fin 41 may be disposed so as to be exposed between the automobile body and the under guard 56. In this case, during the drive of the automobile, the incoming wind enters in between the automobile body and the under guard 56 and the exposed fin 41 can be effectively cooled. Even in this construction, the fin 41 may be disposed parallel to the automobile travelling direction. In this case, the incoming wind entering from between the automobile body and the under guard 56 smoothly flows along the fin 41 without being, for example, stagnated half the way of the automobile traveling direction and, also, will not constitute an air resistance.

Also, the under guard 56 may be provided with an air intake hole 56a through which the air can be drawn in between the automobile body and the under guard 56. This air intake hole 56a is a through-hole which is, for example, inclined rearwardly from the undersurface towards the upper surface of the under guard 56, and the front portion in the undersurface of the fin 41 can be air cooled. During the drive of the automobile, the air can be drawn from the air intake hole 56a in between the automobile body and the under guard 56 and the inverter 31 (FIG. 7) can be air cooled.

Figure 15:
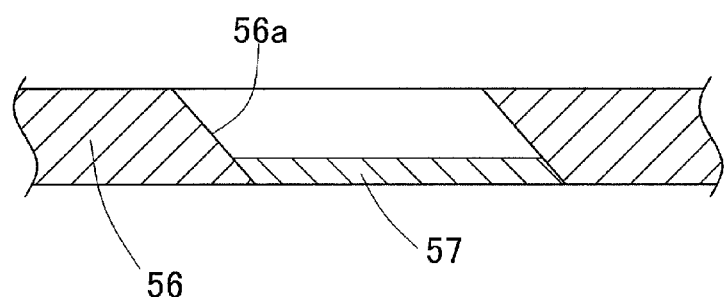
FIG. 15 is an enlarged sectional view showing an important portion of the inverter device.
Figure 16:
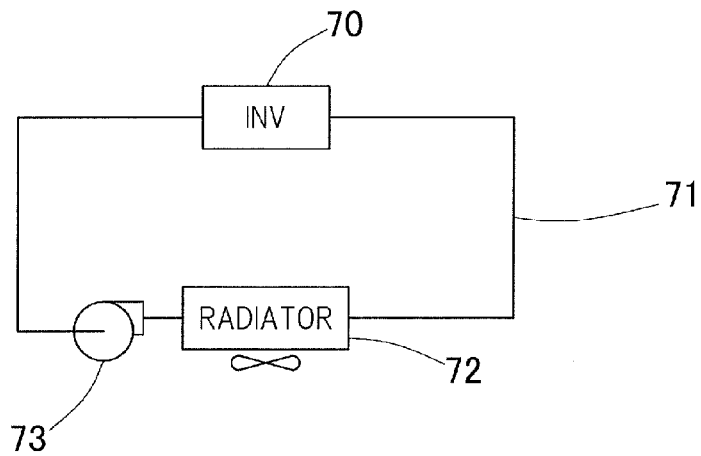
FIG. 16 is a conceptual example diagram showing the conventional cooling structure for the inverter device.

As shown in FIG. 15, the hole 56a in the under guard 56 may be provided with a filter 57 for removing foreign matter. In this case, it is possible to prevent an undesirable ingress of the foreign matter such as, for example, flying objects, which come from the air intake hole 56a together with the air, in between the automobile body and the under guard 56. It is to be noted that the filter 57 may be detachably provided in the hole 56a in the under guard 56.

Although in the foregoing description of the present invention, reference has been made by way of example to the electrically powered automobile of the in-wheel motor type, the present invention is not necessarily limited thereto and can be equally applied to the inverter for driving the other type automobile with the motor (including a hybrid car).

Although the present invention has been fully described in connection with the preferred embodiments thereof with reference to the accompanying drawings which are used only for the purpose of illustration, those skilled in the art will readily conceive numerous changes and modifications within the framework of obviousness upon the reading of the specification herein presented of the present invention. Accordingly, such changes and modifications are, unless they depart from the scope of the present invention as delivered from the claims annexed hereto, to be construed as included therein.

REFERENCE NUMERALS

6 . . . Motor
19 . . . Battery
22 . . . Inverter device
28 . . . Power circuit section
31 . . . Inverter
39 . . . Inverter casing
41 . . . Fin
42 . . . Coolant flow path
43 . . . Pump
44, 44A . . . Pump control unit
55 . . . Stirrer
56 . . . Under guard
56a . . . Air intake hole
57 . . . Filter
S1 . . . inverter temperature detecting unit

What is claimed is:

1. A cooling structure for an inverter device to control an automobile driving motor, which inverter device comprises:
    a power circuit section including an inverter configured to convert a direct current power of a battery to an alternating current power for driving the motor, and an inverter casing to enclose the power circuit section; and
    a fin provided in an outer surface area of the inverter casing, a coolant flow path provided within the inverter casing or in the outer surface area for the flow of a cooling medium therethrough, and a pump disposed on or in the inverter casing to circulate the cooling medium within the coolant flow path.

2. The cooling structure for the inverter device as claimed in claim 1, further comprising an inverter temperature detecting unit to detect the temperature of the inverter and a pump control unit to perform such a control that, in the event that the temperature detected by the inverter temperature detecting unit exceeds a preset value, the pump is driven to circulate the cooling medium.

3. The cooling structure for the inverter device as claimed in claim 1, further comprising a pump control unit to perform such a control that, in the event that an automobile traveling velocity is not higher than a predetermined value, the pump is driven to circulate the cooling medium.

4. The cooling structure for the inverter device as claimed in claim 1, further comprising a cooling water tank to reserve a cooling water provided in the vicinity of a portion within the inverter casing where the fin is provided.

5. The cooling structure for the inverter device as claimed in claim 4, further comprising a stirrer to stir the cooling water within the cooling water tank, the stirrer being provided in the inverter casing.

6. The cooling structure for the inverter device as claimed in claim 1, in an automobile body having an under guard disposed therein, the fin is disposed between the automobile body and the under guard while being exposed.

7. The cooling structure for the inverter device as claimed in claim 6, in which the under guard is provided with an air intake hole defined between the automobile body and the under guard to take air thereinto.

8. The cooling structure for the inverter device as claimed in claim 7, further comprising a filter to remove foreign matter, the filter being disposed in the air intake hole in the under guard.

* * * * *